United States Patent
Kung et al.

(10) Patent No.: US 9,606,167 B2
(45) Date of Patent: Mar. 28, 2017

(54) SYSTEM AND METHOD FOR DETECTING INTEGRATED CIRCUIT ANOMALIES

(75) Inventors: Hsiang-Tsung Kung, Belmont, MA (US); Dario Vlah, Natick, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 630 days.

(21) Appl. No.: 13/565,420

(22) Filed: Aug. 2, 2012

(65) Prior Publication Data

US 2013/0204553 A1   Aug. 8, 2013

Related U.S. Application Data

(60) Provisional application No. 61/514,627, filed on Aug. 3, 2011.

(51) Int. Cl.
*G01R 31/26* (2014.01)
*G06F 11/07* (2006.01)
*G01R 31/3183* (2006.01)
*G01R 31/317* (2006.01)

(52) U.S. Cl.
CPC ... *G01R 31/2601* (2013.01); *G01R 31/31721* (2013.01); *G01R 31/31719* (2013.01); *G01R 31/31835* (2013.01); *G06F 11/0751* (2013.01)

(58) Field of Classification Search
CPC .......... G01R 31/2601; G01R 31/31721; G01R 31/31719; G01R 31/31835; G06F 11/0751
USPC ...... 702/58, 57, 82, 117, 118, 183, 185, 189
See application file for complete search history.

(56) References Cited

U.S. PATENT DOCUMENTS

| | | | | |
|---|---|---|---|---|
| 4,233,682 A * | 11/1980 | Liebergot et al. | ............ | 714/820 |
| 5,414,716 A * | 5/1995 | Bershteyn | ............ | 714/738 |
| 5,497,381 A * | 3/1996 | O'Donoghue et al. | ........ | 714/745 |
| 2005/0251370 A1 * | 11/2005 | Li et al. | ............ | 702/190 |
| 2006/0290373 A1 * | 12/2006 | Takamiya et al. | ............ | 324/765 |
| 2007/0279068 A1 * | 12/2007 | Harres | ............ | 324/522 |
| 2010/0083198 A1 * | 4/2010 | Zhang et al. | ............ | 716/4 |

OTHER PUBLICATIONS

Agrawal et al., "Trojan detection using IC fingerprinting" *IEEE Symp Sec Priv* (2007).
Alkabani et al., "Consistency-based characterization for IC Trojan detection" *Proc ICCAD* pp. 123-127 (2009).
Baraniuk et al., "Compressive sensing" *Lecture Notes IEEE Sign* pp. 118-124 (Jul. 2007).

(Continued)

*Primary Examiner* — Paul D Lee
(74) *Attorney, Agent, or Firm* — Wolf, Greenfield & Sacks, P.C.

(57) ABSTRACT

Circuitry, systems and methods for testing integrated circuits for the presence of anomalies. Techniques include applying a plurality of inputs to an integrated circuit under test to obtain a first plurality of measurements at least partially characterizing power leakage in the integrated circuit under test, encode the first plurality of measurements, by computing a plurality of random linear combinations of measurements in the first plurality of measurements, to obtain a second plurality of encoded measurements determining whether the integrated circuit under test contains at least one anomaly based, at least in part, on the second plurality of encoded measurements.

20 Claims, 6 Drawing Sheets

(56) References Cited

OTHER PUBLICATIONS

Candès et al., "An introduction to compressive sampling" *IEEE Sig Proc Mag* vol. 25 pp. 21-30 (Mar. 2008).
Fernandes et al., "Accurate estimation of vector dependent leakage power in the presence of process variations" *Proc ICCD* pp. 451-458 (2009).
Hansen et al., "Unveiling the ISCAS-85 benchmarks: A case study in reverse engineering" *IEEE Des Test* pp. 72-80 (1999).
Hicks et al., "Overcoming an untrusted computing base: Detecting and removing malicious hardward automatically" *IEEE Symp Sec Priv* pp. 159-172 (2010).
Huffmire et al., "Moats and drawbridges: An isolation primitive for reconfigurable hardware based sytems" *IEEE Symp Sec Priv* (2007).
Nelson et al., "SVD-based ghost circuitry detection" *Springer Verlag* pp. 221-234 (2009).
Singh et al., "Minimum leakage vector computation using weighted partial maxSAT" *IEEE Midwest Symp Cir Sys* pp. 201-204 (2010).
Sturton et al., "Defeating UCI: Building stealthy and malicious hardware" *IEEE Symp Sec Priv* pp. 64-77 (2011).
Waksman et al., "Silencing hardware backdoors" *IEEE Symp Sec Priv* pp. 49-63 (2011).

\* cited by examiner

| Input (state) | μ(nA) | σ(nA) |
|---|---|---|
| "00" | 1 | 0.05 |
| "01" | 5 | 1 |
| "10" | 5 | 1 |
| "11" | 10 | 3 |

SYSTEM AND METHOD FOR DETECTING INTEGRATED CIRCUIT ANOMALIES

CROSS-REFERENCE TO RELATED APPLICATIONS

The present application claims the benefit under 35 U.S.C. §119(e) of U.S. Provisional Application Ser. No. 61/514,627, filed on Aug. 3, 2011, titled, "Detecting Integrated Circuit Trojans," which is hereby incorporated by reference in its entirety.

FEDERALLY SPONSORED RESEARCH

This invention was made with government support under FA8750-10-2-0115 and FA8750-10-2-0180 awarded by the Air Force Research Laboratory. The government has certain rights in the invention.

BACKGROUND

Hardware Trojans are malicious alterations to a circuit, such as an integrated circuit, during design and/or fabrication of the circuit. Such alterations may include addition of circuitry to the circuit, removal of circuitry from the circuit, or any suitable combination thereof. The malicious alterations may be of any suitable size and may be small or large. As one non-limiting example, hardware Trojans may be introduced by adding one or more components (e.g., one or more logic gates, one or more transistors, one or more diodes, etc.) to a circuit, removing one or more such components from a circuit, or any suitable combination thereof. As another non-limiting example, circuitry configured to perform a particular function, such as a microcontroller, may be added to a circuit.

When an integrated circuit contains one or more hardware Trojans, these Trojans may disrupt operation of the integrated circuit or any other circuitry coupled to the integrated circuit. For example, hardware Trojans may be used to cause the integrated circuit to malfunction and/or perform one or more functions, such as a function that may constitute or be part of a security attack.

Detecting the presence of hardware Trojans in integrated circuits is therefore an important problem. Indeed, many semiconductor companies and other businesses outsource manufacture of integrated circuits and/or products comprising integrated circuits to external fabrication facilities. As such, it has become easier to introduce anomalies such as hardware Trojans into integrated circuits, further motivating the development of techniques for detecting hardware Trojans.

However, detecting hardware Trojans is challenging for numerous reasons. One reason is that a hardware Trojan may be small and, for example, may constitute one or a small number of components (e.g., gates, transistors, diodes, etc.) in an integrated circuit comprising many such components (e.g., thousands or more, tens of thousands or more, millions or more, etc.). Another reason is that a hardware Trojan may be dormant until activated and a priori knowledge of how the Trojan is activated is not available. Yet another reason that detecting hardware Trojans is challenging is that their structure and function may be unknown.

Some conventional techniques for detecting hardware Trojans in integrated circuits involve examining the structure integrated circuits for the presence of physical alterations. However, detecting such physical alterations in an integrated circuit requires costly, and possibly destructive, inspection of the integrated circuit that is performed by using expensive equipment.

Other conventional techniques for detecting hardware Trojans are based on the Trojans' use of power. When inputs to an integrated circuit are held constant, the integrated circuit may consume power because components of the integrated circuit (e.g., logic gates, transistors, etc.) may pass (sometimes termed "leak") a small non-zero amount of current. This current is sometimes termed "leakage current" and the corresponding power is sometimes termed "leakage power" or "static power." Because a hardware Trojan may comprise components (e.g., logic gates, transistors, etc.) that draw leakage power, an integrated circuit may be tested for the presence of a hardware Trojan by comparing the amount of power drawn by the integrated circuit with the amount of power drawn by a corresponding Trojan-free integrated circuit.

SUMMARY

In some embodiments, a system is provided for testing integrated circuits for presence of anomalies. The system comprises at least one circuit configured to apply a plurality of inputs to an integrated circuit under test to obtain a first plurality of measurements at least partially characterizing power leakage in the integrated circuit under test, and encode the first plurality of measurements, by computing a plurality of random linear combinations of measurements in the first plurality of measurements, to obtain a second plurality of encoded measurements. The system further comprises at least one processor configured to determine whether the integrated circuit under test contains at least one anomaly based, at least in part, on the second plurality of encoded measurements.

In some embodiments, at least one circuit used for testing integrated circuits for presence of anomalies is provided. The at least one circuit configured to apply a plurality of inputs to an integrated circuit under test to obtain a first plurality of measurements at least partially characterizing power leakage in the integrated circuit under test, and encode the first plurality of measurements by computing a plurality of random linear combinations of measurements in the first plurality of measurements, to obtain a second plurality of encoded measurements to be used in determining whether the integrated circuit under test contains at least one anomaly.

In some embodiments, a method for testing integrated circuits for presence of anomalies is provided. The method comprises applying a plurality of inputs to an integrated circuit under test to obtain a first plurality of measurements at least partially characterizing power leakage by the integrated circuit under test, and encoding the first plurality of measurements by computing a plurality of random linear combinations of measurements in the first plurality of measurements, to obtain a second plurality of encoded measurements. The method further comprises determining whether the integrated circuit under test contains at least one anomaly based, at least in part, on the second plurality of encoded measurements.

The foregoing is a non-limiting summary of the invention, which is defined by the attached claims.

DETAILED DESCRIPTION

The inventors have recognized and appreciated that conventional approaches for detecting anomalies, such as hardware Trojans, in integrated circuits (ICs) are time-consuming and expensive. As previously mentioned, techniques requiring physical inspection of an integrated circuit (IC) require expensive equipment, take a long time to perform and may damage or destroy the IC. However, the inventors have recognized and appreciated that conventional techniques for detecting hardware Trojans based on detecting power leakage in an IC due to the presence of a hardware Trojan are also time-consuming because, as explained with reference to FIG. 1 below, these techniques place demanding input/output (I/O) requirements on chips containing the integrated circuits to be tested for the presence of hardware Trojans. In particular, such conventional techniques require outputting a large amount of data from a chip containing an IC being tested for the presence of hardware Trojans, which is time-consuming and thereby increases the cost of manufacturing the IC.

Figure 1:
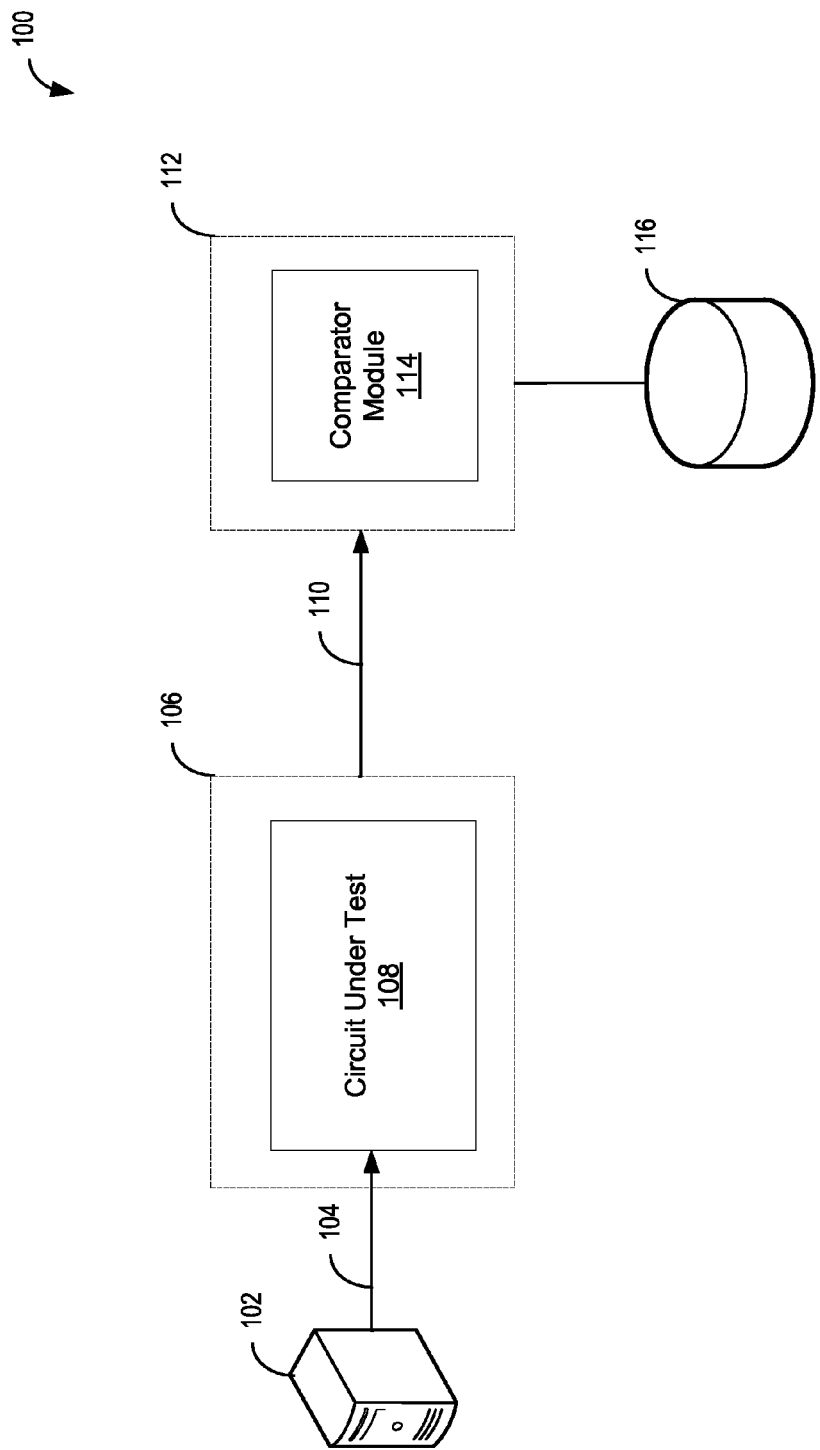
FIG. 1 shows an illustrative system for testing an integrated circuit for the presence of one or more anomalies, in accordance with conventional techniques.

One conventional approach to detecting hardware Trojans based on their power usage is illustrated in FIG. 1, which shows an illustrative system 100 for testing an IC for the presence of one or more anomalies, in accordance with conventional techniques. System 100 comprises computing device 102 configured to generate and apply a set of inputs 104 to chip 106, which comprises an IC under test 108, and obtain corresponding power leakage measurements 110. Thus, a corresponding power leakage measurement may be obtained for each one of inputs 104. Chip 106 may be any of numerous types of circuits and, for example, may be an integrated circuit. As another example, chip 106 may be a die cut from a wafer, the die having the integrated circuit under test formed thereon. As another example, chip 106 may comprise multiple dies and, in some cases, may be a wafer.

Next, comparator module 114, executing on computing device 112 separate from chip 106 (i.e., "off-chip"), compares power leakage measurements 110 with corresponding power leakage measurements of an anomaly-free IC corresponding to the IC under test. Power leakage measurements of the corresponding anomaly-free IC may be obtained in any suitable way (e.g., by simulation, by measuring power leakage levels in an IC known to be anomaly-free, etc.) and may be stored in database 116 communicatively coupled to computing device 112. A determination may be made, by system 100, that IC under test 108 contains one or more hardware Trojans if power leakage measurements 110 deviate from previously obtained power leakage measurements of the corresponding anomaly-free IC.

Figures 5A, 5B:
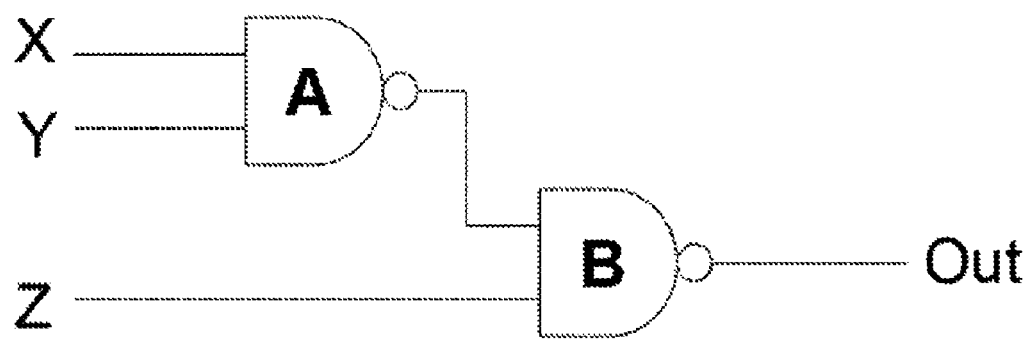
FIG. 5A shows an illustrative circuit.
FIG. 5B shows a table containing illustrative leakage current values for a two-input NAND logic gate.

It should be appreciated, however, that some, but not all, obtained power leakage measurements of an IC may be reliable indicators of the presence of hardware Trojan's in the IC. Indeed, the circuit states in which power leakage due to the presence of a hardware Trojan may be reliably detected are rare. One reason for this is that there may be variability in power leakage measurements of an IC even if the IC does not contain a hardware Trojan. In other words, factors other than a hardware Trojan may contribute to variations of power leakage measurements of an IC under test from what may expected in a corresponding anomaly-free IC. Indeed, power leakage of an IC component (e.g., a logic gate, a transistor, a diode, etc.) may depend on numerous factors including the input provided to the IC component, testing conditions, thermal noise, etc. For example, FIG. 5B shows the leakage current values for a 2-input NAND gate, for three different input combinations. The power leakage of an integrated circuit, comprising multiple such components, therefore depends on these and other factors (e.g., the design of the integrated circuit specifying how the gates are connected, variations in the fabrication process, etc.). Due to the presence of variability in power leakage measurements, a hardware Trojan may be reliably detected by applying those inputs, in response to which, obtained power leakage measurements not only differ from expected power leakage measurements (e.g., as expected in a corresponding anomaly-free IC), but also differ from the expected power leakage measurements such that this difference is unlikely to be explained by power-leakage variability due to factors other than a hardware Trojan (e.g., due to input dependence, thermal noise, circuit design, testing conditions, etc.) alone. In other words, sufficiently large deviations from expected power leakage measurements may be used to detect the presence of hardware Trojans.

As a result, conventional techniques for detecting hardware Trojans comprise applying a large number of different test inputs to an integrated circuit under test and obtaining a corresponding power leakage measurement for each one of the applied inputs. The obtained power leakage measurements are then output from the chip (e.g., chip 106) comprising the IC under test (e.g., integrated circuit 108) and analyzed to determine whether the IC under test contains one or more hardware Trojans. For example, in system 100 shown in FIG. 1, power leakage measurements 110 are output from chip 106 and provided to computing device 112 for subsequent off-chip analysis. Outputting a large number of power leakage measurements from chip 106 may be very time-consuming. Indeed, in a case where an IC under test (e.g., IC 108) comprises N binary logic gates (where N is a positive integer), system 100 may apply all of the $2^N$ possible test inputs to the IC under test. As a result, chip 106 may have to output all $2^N$ power measurements corresponding to the $2^N$ inputs. Such an approach may become infeasible even for moderate values of N (e.g., at least 100, 1000, 10,000, etc.) due to the time required to output all the measurements from the chip comprising the IC under test.

As previously mentioned, the inventors have recognized that outputting a large amount of data (e.g., power leakage measurements) from a chip (e.g., chip 106) comprising an IC under test is time-consuming and expensive and that reducing the amount of data that from the chip comprising the IC under test may improve the process of testing ICs for the presence of anomalies such as hardware Trojans.

The inventors have also recognized and appreciated that deviations in power leakage measurements of an IC under test are sparse in that only a small number of them (relative to the total number of power leakage measurements of an IC under test that may be obtained) may be indicative of the presence of an anomaly (e.g., a hardware Trojan) in the IC under test. The inventors have further recognized that such sparsity may be used to reduce the number of power leakage measurements of an IC under test, which may be output from the chip comprising the IC under test. In particular, the inventors have recognized that compressive sensing (CS) techniques, sometimes termed compressed sensing techniques, may be used to encode obtained power leakage measurements of an IC under test into a smaller set of encoded measurements. This smaller set of encoded power leakage measurements may be output from the chip, decoded off-chip by another computing device, and used to determine whether the IC under test contains one or more anomalies. Additionally, encoded power leakage measurements may be used to identity the location of one or more anomalies in the IC under test, if it is determined that the IC under test contains one or more anomalies. Advantageously, such an approach reduces the amount of data output from the chip comprising the IC under test.

Thus, the inventors have recognized and appreciated that encoding power leakage measurements by using compressive sensing techniques may overcome some of the above-mentioned drawbacks of conventional techniques for detecting anomalies in integrated circuits. However, not every embodiment addresses every one of these drawbacks, and some embodiments may not address any of them. As such, it should be appreciated that the invention is not limited to addressing all or any of the above-discussed drawbacks of these conventional techniques for detecting anomalies in integrated circuits.

Accordingly, in some embodiments, compressive sensing techniques may be applied to encode multiple measurements of an IC under test, which were obtained by applying multiple inputs to the IC under test. The encoded measurements may be output from the chip comprising the IC under test and analyzed, "off-chip," by one or more computing devices to determine whether the IC under test contains at least one anomaly such as hardware Trojan. The computing device(s) may make such a determination at least in part by using appropriate compressive sensing techniques to decode the encoded measurements and use the decoded measurements together with information characterizing an anomaly-free IC corresponding to the IC under test to determine whether the IC under test contains one or more anomalies. If it is determined that the IC under test contains one or more anomalies, the computing device(s) may be further configured to identify a location or locations of the one or more anomalies in the IC under test.

In some embodiments, each of the inputs to be applied to the IC under test may comprise one or more inputs for components (e.g., logic gates, transistors, diodes, etc.) of the IC under test. Additionally, the inputs to be applied to the IC under test may comprise one or more encoding parameters used to encode measurements of the IC under test. In some embodiments, the inputs to be applied to the IC under test may be generated "on-chip" by a chip comprising the IC under test. Additionally or alternatively, the inputs may be generated "off-chip" by one or more computing devices and provided to the chip comprising the IC under test.

In some embodiments, inputs may be applied to an IC under test to obtain any of numerous types of measurements that at least partially characterize power consumption and/or power leakage in the IC under test. For example, direct and/or indirect measurements of power consumption and/or leakage of the IC under test may be obtained. As another example, direct and/or indirect measurements of current consumption and/or leakage may be obtained. Though any other suitable electrical measurements, such as voltage or any other suitable electrical quantity, may be obtained, as aspects of the present invention are not limited in this respect.

In some embodiments, the obtained measurements may be encoded in accordance with a compressive sensing technique. In some embodiments, the obtained measurements may be encoded by computing one or more random linear combinations of obtained measurements. Computing a random linear combination of a group of measurements may comprise computing a weighted sum of measurements in the group of measurements, with the measurements being weighted by random weights. The random weights may be obtained in accordance to one or more suitable probability distributions.

In some embodiments, the encoded measurements may be fewer in number than the number of measurements that were encoded to produce the encoded measurements. For example, in some embodiments N (where N is an integer greater than 0) measurements of an IC under test (e.g., power leakage measurements or any other previously mentioned type of measurement) may be encoded to produce M encoded measurements (where M is an integer greater than 0) such that M is smaller than N. For instance, M may be less than 50% of N, less than 40% of N, less than 30% of N, less than 25% of N, less than 20% of N, less than 15% of N, less than 10% of N, less than 5% of N, or less than 3% of N.

In some embodiments, the encoding may be performed "on-chip" by the circuitry (e.g., a chip) comprising the integrated circuit under test. The circuitry may include any suitable type of circuitry used to calculate one or more random linear combinations of measurements and, for example, may include one or more accumulators, one or more linear shift registers, one or more circular shift registers, one or more selective adders, and/or any other suitable circuitry.

In some embodiments, the encoded measurements may be output from the circuitry on a circuit comprising the IC under test and used by one or more computing devices to determine whether the IC under test contains one or more anomalies (e.g., one or more hardware Trojans). To this end, the computing device(s) may decode the encoded measurements by applying appropriate compressive sensing decoding techniques corresponding to the encoding technique used to encode the measurements. In such embodiments, measurements of an IC under test are encoded "on-chip," but decoded "off-chip."

As discussed in greater detail below with reference to FIGS. 2 and 4B, in some embodiments, a compressive sensing decoding technique may comprise decoding the encoded measurements based at least in part on values of the weights that were used to calculate the random linear combinations to produce the encoded measurements. The decoding technique may be a technique for calculating a solution having a small number of non-zero values. To this end, the decoding technique may comprise calculating one or more values based on an objective function that includes a sparsifying term. For example, the objective function may comprise a sum of absolute values of one or more values of a vector.

In some embodiments, the decoded measurements may be used to determine whether the IC under test contains one or more anomalies. This determination may be made by comparing the decoded measurements with information characterizing a corresponding anomaly-free integrated circuit. The comparison may be made in any of numerous ways by using statistical techniques (e.g., hypothesis testing) as discussed in greater detail below with reference to FIGS. 2 and 4B.

Following below are more detailed descriptions of various concepts related to, and embodiments of, systems, circuitry, and methods according to aspects of the present application. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

Figure 2:
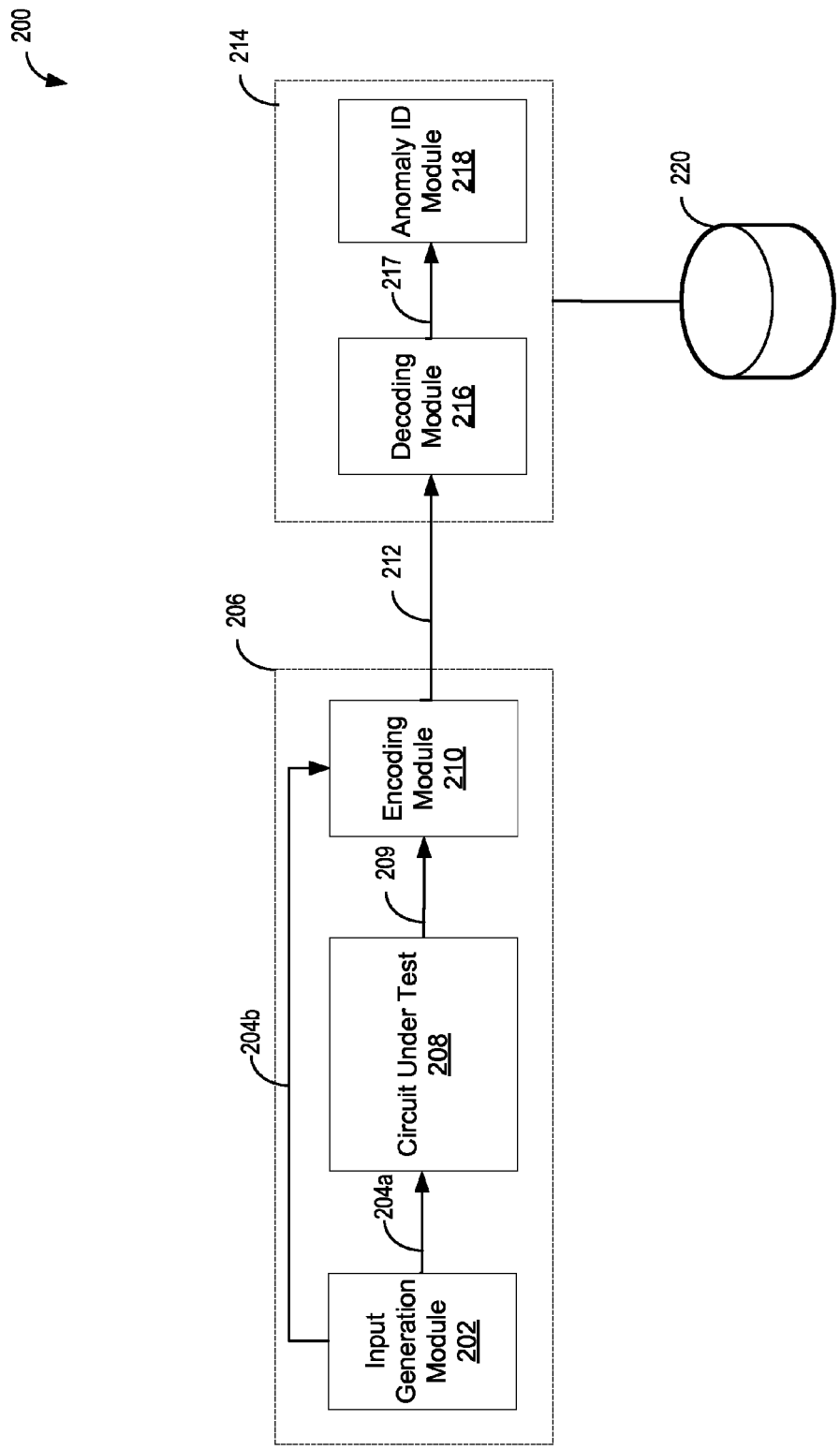
FIG. 2 shows an illustrative system for testing an integrated circuit under test for the presence of one or more anomalies, in accordance with some embodiments.

FIG. 2 shows an illustrative system 200, according to some embodiments that allows for testing an IC under test for the presence of one or more anomalies. In particular, system 200 comprises circuit 206 comprising an integrated circuit under test 208. Circuit 206 may be any of numerous types of circuits. For example, circuit 206 may be an integrated circuit including IC under test 208, circuitry used for functionally testing IC under test 208 (e.g., by applying inputs and obtaining corresponding outputs), generating inputs to apply to IC under test 208, encoding corresponding outputs, and/or any other suitable circuitry. Circuit 206 may be a chip, which may be a die cut from a wafer, the die having the integrated circuit under test 208 formed thereon. As another example, circuit 206 may comprise multiple dies and, in some cases, may be a wafer or a portion of a wafer. As yet another example, circuit 206 may be a circuit board adapted to interface with IC under test 208. It should be appreciated that although in the illustrated embodiment circuit 206 is shown as a single circuit, in some embodiments, circuit 206 may comprise multiple circuits, as aspects of the present invention are not limited in this respect.

Integrated circuit under test 208 may be any type of integrated circuit to be tested for the presence of one or more anomalies, such as hardware Trojans. IC under test 208 may comprise one or more passive components (e.g., one or more capacitors, one or more inductors, one or more resistors, etc.), one or more active components such as transistors, diodes, logic gates, electrical switches, and/or any other suitable components, as aspects of the present invention are not limited in this respect.

Circuit 206 comprises input generation module 202 configured to generate inputs 204a to apply to integrated circuit under test 208. Input generation module 202 may generate any suitable type of inputs that may be used to test IC under test 208 for the presence of one or more anomalies. An input generated by input generation module 202 may comprise input for one or more components of IC under test 208. For example, an input generated by input generation module 202 may comprise input for one or more logic gates, one or more transistors, one or more diodes, and/or one or more other components in the IC under test. As an illustrative non-limiting example, consider the circuit shown in FIG. 5A consisting of two interconnected NAND logic gates. Input generated by the input generation module may comprise a value for each of the bits X, Y, and Z (e.g., "010").

Input generation module 202 may generate any suitable number of inputs to be applied to the IC under test 208. In some embodiments, input generation module 202 may be configured to generate all of the different inputs that may be applied to the IC under test 208. In the illustrative circuit shown in FIG. 5A, for instance, there are $2^3$ different inputs (each of bits X, Y, Z, may take the value 0 or 1) that may be applied to the circuit and input generation module 202 may generate all of these different inputs. Though, in other embodiments, input generation module 202 may be configured to generate some, but not all, of the different input that may be applied to the IC under test 208. In this case, input generation module 202 may determine which of the different inputs to generate in any suitable way, as aspects of the present invention are not limited in this respect. For example, input generation module 202 may generate different inputs at random. As another example, input generation module 202 may receive input specifying which inputs to generate for application to IC under test 208.

Regardless of the manner in which inputs 204a are generated by input generation module 202, these inputs may be applied (e.g., by circuit 206) to circuit under test 208 to obtain measurements 209 of the IC under test 208. The measurements may be any suitable types of measurements and may be any of the previously mentioned types of measurements including, but not limited to, power leakage measurements, power consumption measurements, current leakage measurements, and current consumption measurements. In some embodiments, measurements 209 may comprise a corresponding measurement for each one of inputs 204a applied to the IC under test 208.

Additionally, in the illustrated embodiment, input generation module 202 may be configured to generate one or more encoding parameters 204b used by encoding module 210 to encode measurements of IC under test 208. Input generation module 202 may be configured to generate any suitable encoding parameters and, for example, may be configured to generate values of weights used to calculate random linear combinations in encoding module 210. Input generation module 202 may generate these values in any suitable way using any suitable circuitry. As one non-limiting example, input generation module 202 may generate values of weights used to calculate random linear combinations at least in part by using a linear feedback shift register. Though it should be appreciated that, in some embodiments, input generation module 202 may be provided with information that it may use to generate the weights or the values of the weights themselves, as aspects of the present invention are not limited in this respect.

As shown in the illustrated embodiment, circuit 206 further comprises encoding module 210 configured to encode measurements of IC under test 208 using a compressive sensing encoding technique. In compressive sensing, a set of N measurements (where N is an integer greater than 0) may be encoded (compressed) by computing M random linear combinations (where M is an integer greater than 0) of measurements in the set. As a non-limiting illustrative example of a compressive sensing encoding technique, let the set of N measurements be represented by an N-by-1 vector $x=(x_1, x_2, \ldots, x_N)$. Then x may be encoded to produce an M-by-1 vector of encoded measurements y by computing:

$$y=\Phi x.$$

where the matrix $\Phi$ is an M×N matrix, called the "measurement matrix," comprising weights for computing the M random linear combinations.

Accordingly, encoding module 210 may be configured to calculate one or more random linear combinations of measurements 209 to produce encoded measurements 212. Encoding module 210 may be configured to calculate one or more random linear combinations of measurements 209 by using encoding parameters 204b provided by input generation module 202. For example, encoding module 210 may be configured to calculate sums of measurements 209 by using weights supplied as part of encoding parameters 204b.

Figure 3:
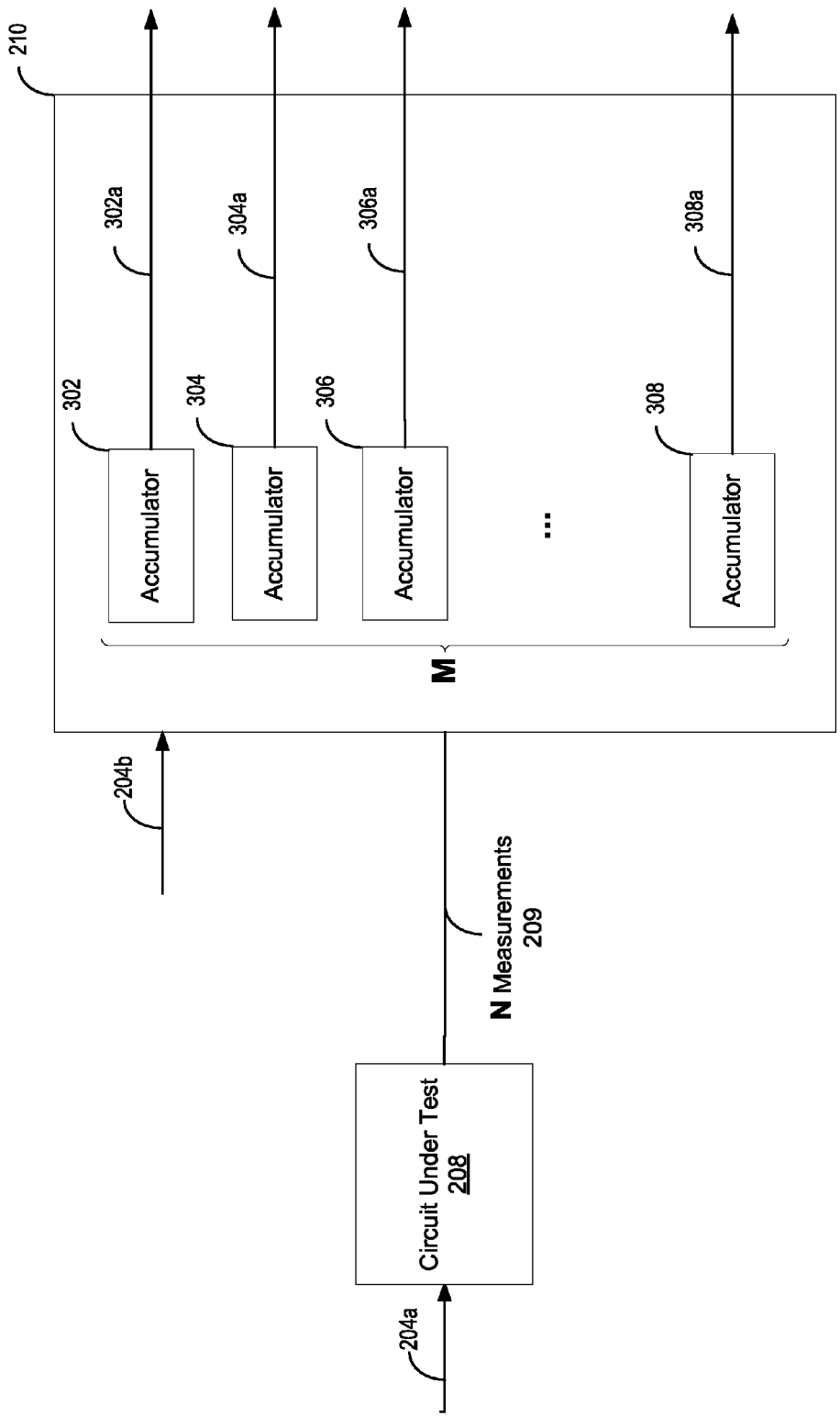
FIG. 3 shows additional details of the system of FIG. 2, in accordance with some embodiments.

Encoding module 210 may comprise any suitable circuitry to calculate one or more random linear combinations of measurements 209. For example, as shown in FIG. 3, encoding module 210 may comprise M accumulators 302-308 that may be used to calculate M encoded measurements 302a-308a based on measurements 209 and encoding parameters 204b. Though, it should be appreciated that encoding module 210 may comprise other circuitry, in addition to or instead of accumulators 302-308, such as selective adders, circular shift registers, memory, or any other suitable circuitry, as aspects of the present invention are not limited in this respect.

System 200 further comprises computing device 214 configured to receive encoded measurements 212 and use these measurements to determine whether IC under test 208 contains one or more anomalies, such as one or more hardware Trojans. To this end, computing device may be configured to execute decoding module 216 and anomaly ID module 218. Computing device 214 may be any suitable computing device and, for example, may be computing device 500 described with reference to FIG. 5 below. It should be appreciated that although, in the illustrated embodiment, a single computing device 214 is shown, multiple computing devices may operate to use encoded measurements 212 to determine whether IC under test 208 contains one or more anomalies.

Decoding module 216 may comprise one or more computer programs that, when executed by computing device 214, are configured to decode encoded measurements 212 in accordance with a compressive sensing decoding technique. The one or more computer programs forming, in part, decoding module 216 may be stored on one or more non-transitory computer readable media of computing device 214 or stored on one or more non-transitory computer readable media located remotely from and accessible by computing device 214. In this respect, decoding module 216 may comprise a combination of software and hardware (e.g., program instructions stored on at least one non-transitory computer readable medium and one or more processors to execute the instructions).

As a non-limiting illustrative example of a compressive sensing decoding technique, let a set of N measurements, represented by an N-by-1 vector $x=(x_1, x_2, \ldots, x_N)$, be encoded to produce an M-by-1 vector of encoded measurements y by computing:

$$y=\Phi x.$$

as previously described. The vector x may have a sparse representation in a basis represented by an N-by-N matrix $\Psi$ (the columns of the matrix may be basis vectors), so that $x=\Psi s$, where K<N elements of s are non-zero. Such a vector x is sometimes called K-sparse because it may be represented by using K elements in the basis represented by the matrix $\Psi$. A compressive sensing decoding technique may be used to recover measurements x from encoded measurements y by solving the system of equations $y=\Phi x$, even in a situation where there are more unknowns (N) than equations (M).

According to compressive sensing theory, values of the vectors x may be obtained from the vector encoded measurements y with high probability when $\Phi$ is a random matrix and when M is O(K log(N/K)) where O( ) is "big-oh" notation. For example, x may be recovered by solving for s according to:

$$\min_{s \in \mathbb{R}^N} \|s\|_{\ell_1} \text{ subject to } y = \Phi x,$$

$$x = \Psi s.$$

and then calculating:

$$X=\Psi s.$$

In this instance, the objective function contains a sparsifying term (i.e., $\|s\|_{L1}$) in that minimizing the 1-1 norm (i.e., sum of absolute values of entries of the vector s) minimizes the number of non-zero values in the solution.

The above-described optimization problem may be solved by using any of numerous techniques including any of numerous linear programming algorithms, as discussed in greater detail below. It should be appreciated that the above-described compressive sensing decoding technique is non-limiting example of a compressive sensing decoding technique and that any other suitable compressive sensing decoding technique may be used, as aspects of the present invention are not limited in this respect.

Accordingly, in some embodiments, decoding module 216 may be configured to decode encoded measurements 212 to obtain decoded measurements 217 by using any suitable compressive sensing decoding technique. In some embodiments, decoding module 216 may be configured to decode encoded measurements 212 based at least in part on encoded measurements 212 and encoding parameters 204b. In particular, decoding module 216 may be configured to use one or more weights used by encoding module 210 to compute linear combinations of measurements 209.

In some embodiments, decoding module 216 may be configured to decode encoded measurements 212 at least in part by calculating one or more values based on an objective function that includes a sparsity constraint (e.g., such as the above-described objective function and other objective functions described below) and/or another objective function subject to a sparsity constraint.

In some embodiments, decoding module 216 may be configured to decode encoded measurements 212 at least in part by using information characterizing an anomaly-free IC corresponding to the IC under test 208. Any of numerous types of information characterizing an anomaly-free IC corresponding to the IC under test 208 may be used by decoding module 216. In some embodiments, information indicative of measurement values that may be obtained from the anomaly-free IC may be used. For example, such information may comprise measurement values previously obtained from the anomaly-free IC. Additionally or alternatively, such information may comprise statistics (e.g., mean, median, standard deviation, variance, etc.) calculated from measurement values previously obtained from the anomaly-free IC. As another example, information indicative of measurement values that may be obtained from the anomaly-free IC may comprise simulated measurement values, obtained at least in part by simulating the behavior of the anomaly-free IC. Additionally or alternatively, such information may comprise statistics (e.g., mean, median, standard deviation, variance, etc.) of these simulated measurement values.

Information characterizing an anomaly-free IC corresponding to IC under test 208 may be used in any of numerous ways for decoding encoded measurements 212. In some embodiments, encoded measurements may be decoded by using the information characterizing the anomaly-free IC to identify deviations in measurements (e.g., power leakage measurements or any other previously mentioned type of measurements) of IC under test 208 from expected corresponding measurements in the corresponding anomaly-free IC. The inventors have recognized and appreciated that such deviations may be rare/sparse and, that being the case, compressive sensing decoding techniques may be applied to identify these deviations from the encoded measurements.

As one non-limiting example, when circuit 206 obtains power leakage measurements 209 from IC under test 208 and encodes these measurements to produce encoded measurements 212, decoding module 216 may decode encoded measurements 212 at least in part by identifying deviations between power leakage measurements and expected power leakage measurements of the corresponding anomaly-free IC.

Another non-limiting example of a compressive sensing decoding technique for decoding encoded measurements 212 is described below. Let an N-by-1 vector $x=(x_1, x_2, \ldots, x_N)$ represent a vector of unknown measurements of IC under test 208. Decoding module 216 may be configured to obtain x from the M-by-1 vector y of encoded measurements 212 based on information characterizing a corresponding anomaly-free IC. This may be done in any suitable way and, for example, may be done by solving the following optimization problem:

$$\min \sum \left| \frac{d_i}{\sigma_i} \right| \text{ subj.}$$

$$y = \Phi \begin{bmatrix} g_1 + d_1 \\ g_2 + d_2 \\ \ldots \\ g_N + d_N \end{bmatrix}$$

where the summation is defined over the index i ranging from 1 to N, each $d_i = x_i - g_i$ is a deviation between a measurement $x_i$ of an IC under test and a corresponding expected measurement $g_i$ of an anomaly-free IC corresponding to the IC under test, and $\sigma_i$ is a statistic (e.g., a standard deviation, variance, etc.) indicative of variability in corresponding measurements (e.g., previously-obtained or predicted measurements) of the anomaly-free IC. As previously mentioned, the matrix $\Phi$ is an M×N matrix, called the "measurement matrix," comprising weights for encoding measurements of the IC under test.

It should be appreciated that the above-described deviations may be sparse. For example, in an ideal case without any variability in power leakage (or any other type of) measurements, it may be expected that each of the deviations $d_i$ is equal to 0 unless an anomaly, such as a hardware Trojan, is present in the circuit under test. As such, the inventors have appreciated that compressive sensing decoding techniques may be applied to identify the deviations $d_i$ from the encoded measurements 212.

The above-described optimization problem may be solved using any of numerous linear programming techniques. To this end, decoding module 216 may utilize one or more software packages implementing these linear programming techniques. For example, a decoding module 216 may use one or more compressed sensing software packages, numerical linear algebra software packages, and/or any other suitable software. It should also be appreciated that the above-described optimization problem may be parallelized and, as such, may be solved at least in part by one or more processors and/or one or more graphical processing units.

Anomaly ID module 218 may comprise one or more computer programs that, when executed by computing device 214 is configured to determine whether IC under test 208 comprises one or more anomalies by using decoded measurements 217. The one or more computer programs forming, in part, anomaly ID module 218 may be stored on one or more non-transitory computer readable media of computing device 214 or stored on one or more non-transitory computer readable media located remotely from and accessible by computing device 214. In this respect, anomaly ID module 218 may comprise a combination of software and hardware (e.g., program instructions stored on at least one non-transitory computer readable medium and one or more processors to execute the instructions).

Anomaly ID module 218 may use decoded measurements 217 to determine whether IC under test 208 comprises one or more anomalies in any suitable way. In some embodiments, anomaly ID module 218 may use information about an anomaly-free IC circuit corresponding to the IC under test 208 to determine whether IC under test 208 comprises one or more anomalies. To this end, anomaly ID module 218 may determine whether one or more of the decoded measurements are indicative of a level of power leakage in the IC under test 208 that substantially deviates from levels of power leakage in an anomaly-free integrated circuit corresponding to the integrated circuit under test. Such a determination may be made using any of numerous techniques including statistical techniques, as described in greater detail below with reference to FIG. 4B.

If anomaly ID module 218 determines that IC under test 208 contains one or more anomalies, anomaly ID module 218 may use decoded measurements 217 to identify a location in the IC under test of each of one or more such anomalies. In some embodiments, the anomaly ID module 218 may identify an input among inputs 204a that at least partially contributed to the determination that the IC under test 208 contains an anomaly and use the identified input to determine the location of the anomaly in the IC under test. Such an input may be identified in any suitable way and, for example, may be identified based at least in part on the value of the measurement corresponding to the input. As a specific example, anomaly ID module 218 may identify an input among inputs 204a as an input that at least partially contributed to the determination that the IC under test 208 contains an anomaly, if the value of the measurement corresponding to the input deviates from a measurement (in response to the same input) of a corresponding anomaly-free IC.

When a particular input indicates the presence of an anomaly in an IC under test, that input may be used to identify the location of the anomaly in the IC under test. This may be done in any suitable way. For example, in some embodiments, the input under test may be analyzed to determine which components (e.g., logic gates, transistors, diodes, etc.) in the IC under test the input is designed to test. The location of the anomaly may be identified based on where these components are located in the IC under test. As a specific example, if an input is designed to test a logic gate by providing a particular input to the logic gate and applying this input to the IC under test results in one or more corresponding measurements that deviates from an expected measurement or measurements, the location of the logic gate may be the location of an anomaly in the circuit under test.

It should be appreciated that system 200 is illustrative and that many variations of illustrative system 200 are possible. For example, although in the illustrated embodiment system 200 is configured to test a single integrated circuit under test (IC 208) for the presence of one or more anomalies, in some embodiments, system 200 may be configured to test each of multiple integrated circuits under test for the presence of one or more anomalies, such as hardware Trojans. As another example, although in the illustrated embodiment, inputs applied to the IC under test 208 are generated on-chip using circuit 206 (e.g., by using input generation module 202), in some embodiments, inputs may be generated off-chip by using one or more computing devices and provided to circuit 206 to be applied to IC under test 208.

An integrated circuit under test may be tested for the presence of one or more anomalies using any of numerous processes, which may be performed at least in part by using illustrative system 200 described with reference to FIG. 2, or any other suitable system. One such illustrative process is shown in FIG. 4A, which is a flowchart of an illustrative process 400 for obtaining encoded measurements of an IC under test. Process 400 may be performed at least in part by circuitry comprising the IC under test and, for example, may be performed on-chip by circuit 206 described with reference to FIG. 2.

Process 400 begins at act 402, where one or more test inputs to be applied to an IC under test, may be generated. As such, N test inputs may be generated where N is any suitable positive integer. The test inputs may be generated by any suitable component of a system executing process 400. In some embodiments, test inputs may be generated on-chip by circuitry on a circuit comprising the IC under test. For example, in embodiments where process 400 is being executed by system 200, test inputs may be generated by input generation module 202. In other embodiments, however, test inputs may be generated off-chip by one or more computing devices and provided to the circuit comprising the IC under test.

The test inputs, generated at act 402, may comprise any of the inputs that may be generated by input generation module 202, as previously described with reference to FIG. 2. As one non-limiting example, each of the test inputs generated at act 402 may comprise input for one or more components (e.g., logic gates, transistors, diodes, etc.) of the IC under test. Also, any suitable number N of test inputs may be generated. For example, as previously described, some or all of the different types of test inputs that may be applied to an IC under test may be generated.

Regardless of the manner in which test inputs are generated, process 400 proceeds to act 403, where encoding parameters used to encode measurements of an IC under test may be generated. As previously described with reference to input generation module 202, any suitable encoding parameters may be generated and, in some embodiments, weights used to calculate linear combinations of measurements may be generated in act 203. The generated weights may take on any suitable values. For example, the value of a generated weight may be −1, 0, or 1. As another example, the value of a generated weight may be any real number between −1 and 1. As yet another example, the value of a generated weight may be any real number.

The weights may be generated in any suitable way and, for example, may be generated according to one or more probability distributions. For example, one or more weights may be generated according to a distribution of a Bernoulli random variable (biased or unbiased). As another example, one or more weights may be generated according to a distribution of a Gaussian random variable. Though, it should be appreciated that weights may be generated according to any of numerous other types of distributions (e.g., log-Normal distribution, exponential distribution, uniform distribution, truncated Gaussian distribution, etc.), as aspects of the present invention are not limited in this respect.

Next, process 400 proceeds to acts 404 and 406. In act 404, the N test inputs generated in act 402 are applied to an IC under test to obtain a corresponding set of N measurements of the IC under test. The obtained measurements may be any of the previously-mentioned types of measurements, such as power/current leakage and/or consumption measurements, or any other suitable measurements. In act 406, the N measurements of the IC under test are encoded into a set of M encoded measurements. This encoding may be performed by using any of the compressive encoding techniques previously described with reference to FIG. 2 and, for example, may be performed by calculating random linear combinations of measurements. Each random linear combination of measurements may be obtained by computing a weighted sum of measurements using the weights calculated in act 403.

Measurements of an IC under test may be encoded by any suitable component of a system executing process 400. In some embodiments, measurements may be encoded on-chip by circuitry on a circuit comprising the IC under test. For example, in embodiments where process 400 is being executed by system 200, measurements may be encoded by encoding module 210.

Next, process 400 proceeds to act 408, where the encoded measurements are output from the circuit used to encode the measurements to another computing device. For example, as previously described with reference to FIG. 2, encoded measurements may be output from a circuit (e.g., circuit 206) comprising the IC under test to another computing device or devices (e.g., computing device 214).

Next, process 400 proceeds to act 410, where it is determined whether another IC circuit should be tested for the presence of one or more anomalies, such as hardware Trojans. If it is determined that another IC circuit should be tested for the presence of one or more anomalies, process 400 loops back, via the YES branch, to act 402 and acts 402-408 and decision block 410 are repeated. Such a determination may be made in numerous situations, for example, in cases where process 400 is applied to an integrated circuit (e.g., a wafer, a die, etc.) comprising multiple integrated circuits to be tested for the presence of one or more anomalies. On the other hand, if it is determined that no other IC circuit is to be tested for the presence of one or more anomalies, process 400 completes.

Figure 4B:
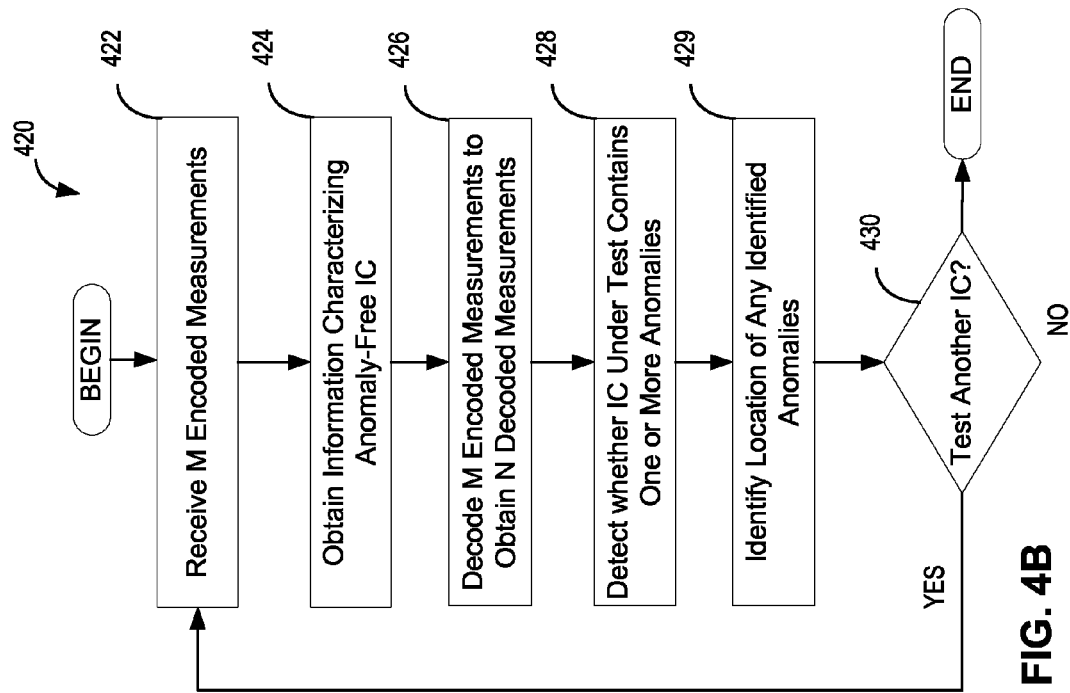
FIG. 4B is a flowchart of an illustrative process for decoding, encoded measurements of an integrated circuit under test, and using the decoded measurements to determine whether the integrated circuit contains at least one anomaly, in accordance with some embodiments.
Figure 4A:
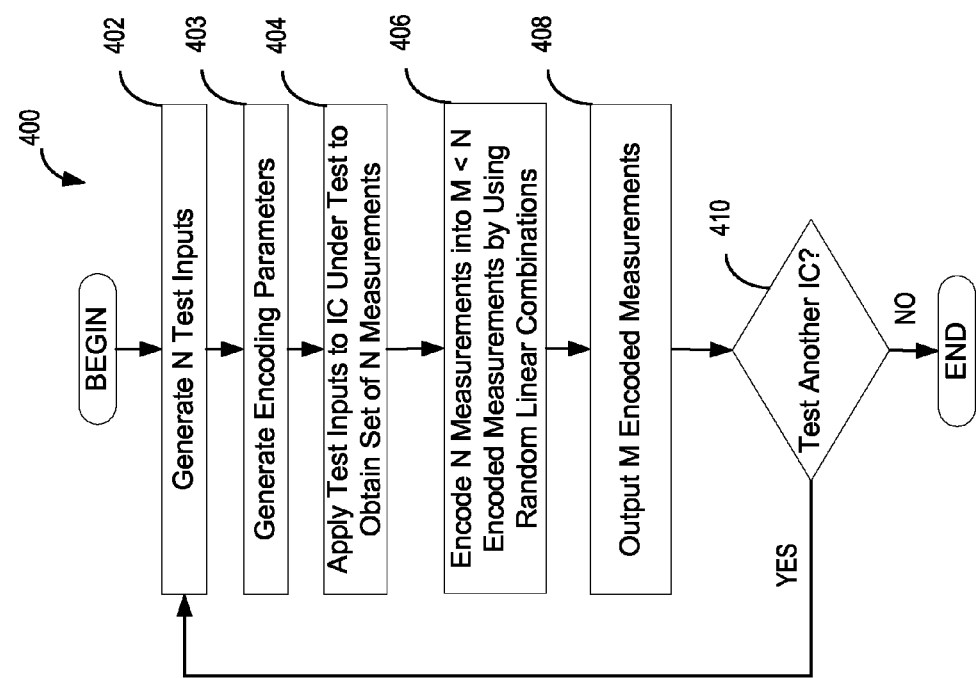
FIG. 4A is a flowchart of an illustrative process for obtaining encoded measurements of an integrated circuit under test, in accordance with some embodiments.

Another illustrative process is shown in FIG. 4B, which is a flowchart of an illustrative process 420 for decoding encoded measurements of an IC under test and using the decoded measurements to determine whether the IC under test contains at least one anomaly. Process 420 may be performed by any suitable computing device and, for example, may be performed by computing device 214 described with reference to FIG. 2.

Process 420 begins in act 422, where one or more encoded measurements of an IC under test may be received. As such, M encoded measurements may be received, where M is any suitable positive integer. In some embodiments, the received encoded measurements may be measurements output as a result of executing process 400, though the received encoded measurements may have been generated by any other suitable process, as aspects of the present invention are not limited in this respect.

Next, process 420 proceeds to act 424, where information characterizing an anomaly-free IC corresponding to the IC under test may be obtained. Such information may comprise any of the previously mentioned types of information including, but not limited to, measurement values previously obtained from the anomaly-free IC or a simulation of the anomaly-free IC as well as any statistics (e.g., mean, median, standard deviation, variance, etc.) of such measurements. These measurements may be any of the previously mentioned types of measurements such as power/current leakage and/or consumption measurements or any other suitable measurements.

Additionally or alternatively, the information may comprise one or more parameters for a model or models of measurement values that may be obtained from an anomaly-free IC. In some embodiments, the information may comprise one or more parameters for a statistical model or models of measurement values that may be obtained from an anomaly-free IC. For example, the information may include one or more parameters of one or more probability distributions characterizing the variability of measurement values that may be obtained from the anomaly-free IC. Any of numerous types of distributions (e.g., log-Normal distribution, Gaussian distribution, exponential distribution, any probability distribution supported on the positive real line, etc.) may be used to characterize the variability of measurements that may be obtained from the anomaly-free IC. As such, the information received in act 424 may comprise one or more parameters of any such distribution.

As an illustrative non-limiting example, consider the 2-NAND logic gate circuit shown in FIG. 5A. Information characterizing an anomaly-free IC corresponding to the 2-NAND gate circuit may comprise parameters such as those shown in the table of FIG. 5B. Each row of the table shows a mean parameter and a standard deviation parameter of a log-Normal distribution characterizing the variability of leakage current of a two-input binary NAND logic gate for one of the four possible input states to the NAND logic gate.

It should be appreciated that such information may be used to obtain a statistical model characterizing the variability in the leakage current of a larger circuit comprising the NAND logic gate, such as the illustrative circuit shown in FIG. 5A, which takes inputs comprising values for three bits (X, Y, and Z). The leakage current distribution for each of these 8 inputs may be obtained as a sum of log-normal random variables, each corresponding to one gate in a specific state. For example, consider applying input <0,0,0> to the circuit of FIG. 5A, that is, X=0, Y=0, Z=0. In this case, gate A will have to inputs <0,0> and gate B inputs <1,0>, so that variability in current leakage of these gates may be modeled by log-normal distributions with parameters from the first and third rows of the table shown in FIG. 5B, respectively. As a result, the variability in current leakage of the entire circuit may be modeled by the sum of these log normal distributions.

Regardless of the type of information obtained at act 424, process 420 next proceeds to act 426, where the encoded measurements received at act 422 are decoded to obtain a set of decoded measurements. The decoding may be performed in any suitable way and, for example, may be performed in any of the ways previously described with reference to decoding module 216, illustrated in FIG. 2. For example, in some embodiments, the encoded measurements may be decoded by using a compressive sensing decoding technique. As previously described, in some instances, such a decoding technique may comprise using one or more encoding parameters (e.g., weights used to compute one or more linear combinations of measurements) used to encode the measurements of the IC under test. Also, as previously described, in some embodiments, such a decoding technique may comprise using information characterizing an anomaly-free IC corresponding to the IC under test to decode the encoded measurements. For example, the information obtained in act 424 may be used as part of a compressive sensing decoding technique.

Next, process 420 proceeds to act 428, where the decoded measurements may be used to determine whether the IC under test contains one or more anomalies. Act 428 may be performed by any suitable component of a system configured to perform process 420. For example, in embodiments where system 200 performs process 420, act 428 may be performed at least in part by anomaly ID module 218.

The decoded measurements may indicate whether the IC under test contains one or more anomalies if one or more of the decoded measurements substantially deviates from expected measurements in the corresponding anomaly-free IC. Such a determination may be made using any of numerous techniques including statistical techniques including, but not limited to, statistical hypothesis testing.

In some embodiments, a statistical model of measurements (e.g., power/current leakage measurements or any other suitable measurements) of an anomaly-free IC may be used to calculate a likelihood of a decoded measurement and check whether the calculated likelihood is less than a specified threshold. If the likelihood is less than the specified threshold, then the value of that decoded measurement may be indicative of the presence of one or more anomalies in the IC under test (because, for example, it may not likely be explained by measurement variability in an anomaly-free IC). Such a threshold is may be set in any suitable way and, in some instances, may be set to achieve a desired false alarm rate, as is known in statistical hypothesis testing.

As a result, in some embodiments, it may be determined that the IC under test contains one or more anomalies when the likelihoods of at least a certain percentage of decoded measurements fall below the specified threshold. For example, it may be determined that the IC under test contains one or more anomalies when the likelihoods of at least one percent (or of at least five percent, of at least ten percent, of at least twenty percent, of at least twenty-five percent, etc.) of decoded measurements fall below the specified threshold.

Regardless of the way in which a determination is made as to whether an IC under test contains one or more anomalies, process 420 proceeds to act 429, where a location of one or more anomalies (if any such anomalies were detected at act 428) may be determined. The location of any detected anomaly may be determined in any suitable way and, for example, may be determined in any of the ways previously described with reference to anomaly ID module 218, or in any other suitable way.

Next, process 420 proceeds to act 430, where it is determined whether another IC circuit should be tested for the presence of one or more anomalies. If it is determined that another IC circuit should be tested for the presence of one or more anomalies, process 420 loops back, via the YES branch, to act 422 and acts 422-428 and decision block 430 are repeated. Such a determination may occur in numerous situations, for example, in cases where process 420 is applied to (encoded) measurements of multiple integrated circuits to be tested for the presence of one or more anomalies. On the other hand, if it is determined that no other IC circuit is to be tested for the presence of one or more anomalies, process 420 completes.

It should be appreciated that process 420 is illustrative and that many variations of process 420 are possible. For example, although in the illustrated embodiment multiple ICs may be tested for the presence of anomalies, this is done sequentially with to each IC being analyzed independently from the other ICs. However, in some embodiments, decoded measurements obtained from each IC in a group of multiple IC's may be processed jointly in order to determine whether one or more of the ICs in the group contains one or more anomalies. For example, in some instances, an IC in a group of ICs may be determined to contain an anomaly when likelihoods of decoded measurements of at least a certain percentage (e.g., at least 10%, at least 20%, at least 25%, at least 50%, etc.) of IC's in the group fall below a specified threshold. Such joint analysis techniques may improve detection performance by reducing the numbers of false positives (a false positive refers to a case where an anomaly-free IC is determined to contain an anomaly) and/or the numbers of false negatives (a false negative refers to a case where an IC containing an anomaly is determined to be anomaly-free).

Having thus described several aspects and embodiments of the technology described in the application, it is to be appreciated that various alterations, modifications, and improvements will readily occur to those skilled in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present application involving the performance of methods may utilize program instructions executable by a device (e.g., a computer, a processor, or other device) to perform, or control performance of, the methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments discussed above. The computer readable medium or media can be transportable, such that the program or programs stored thereon can be loaded onto one or more different computers or other processors to implement various ones of the aspects discussed above. In some embodiments, computer readable media may be non-transitory media.

The terms "program" or "software" are used herein in a generic sense to refer to any type of computer code or set of computer-executable instructions that can be employed to program a computer or other processor to implement various aspects as discussed above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smart phone or any other suitable portable or fixed electronic device.

Figure 6:
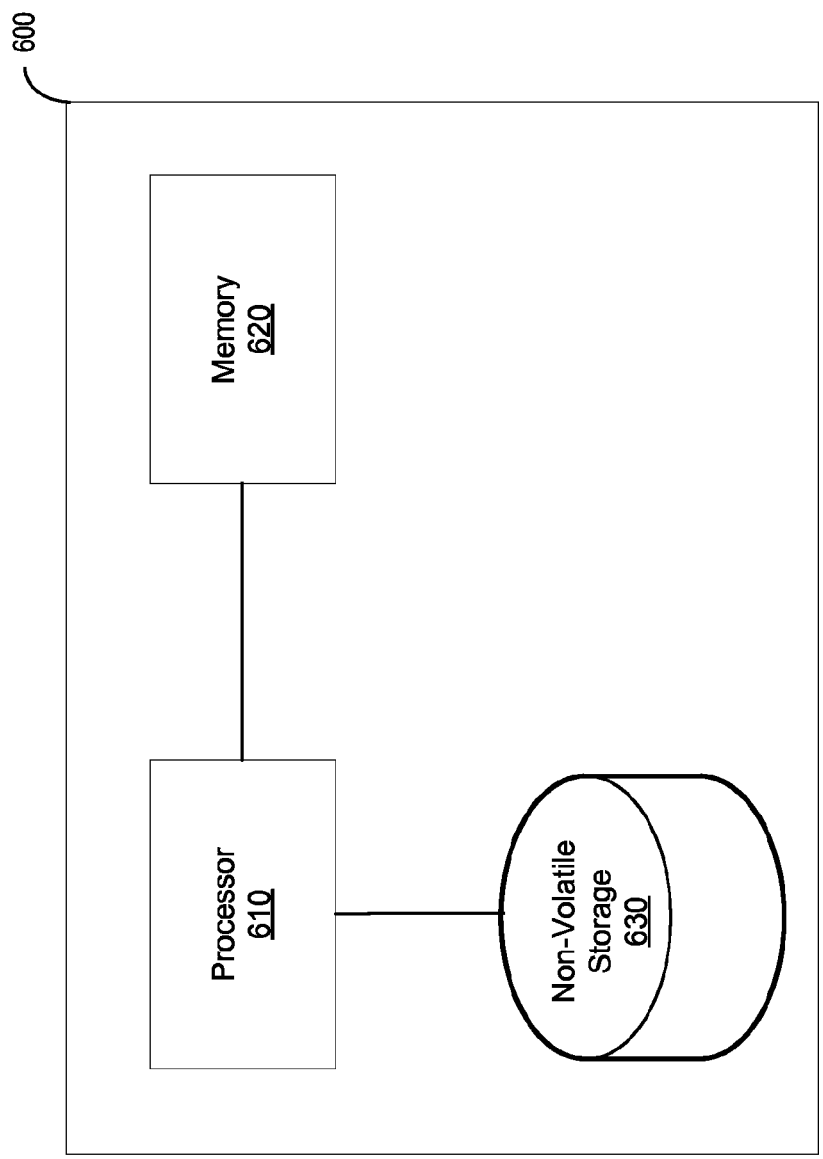
FIG. 6 shows an illustrative implementation of a computer system that may be used in connection with some embodiments.

A computer system that may be used in connection with any of the embodiments of the invention described herein is shown in FIG. 6 such as, but not limited to, computing devices 102, 202, 112, and 214. The computer system may include one or more processors 610 and one or more non-transitory computer-readable storage media (e.g., memory 620 and one or more non-volatile storage media 630). The processor 610 may control writing data to and reading data from the memory 620 and the non-volatile storage device 630 in any suitable manner, as the aspects of the invention described herein are not limited in this respect. To perform any of the functionality described herein, the processor 610 may execute one or more instructions stored in one or more computer-readable storage media (e.g., the memory 620), which may serve as non-transitory computer-readable storage media storing instructions for execution by the processor 610.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as discussed, some aspects may be embodied as one or more methods including, but not limited to, any method including steps described with reference to illustrative processes 400 and 420 and FIGS. 4A-4B. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A system for testing integrated circuits for presence of anomalies, the system comprising:
    at least one circuit configured to:
        apply a plurality of inputs to a manufactured integrated circuit under test to obtain a plurality of measurements consisting of N measurements at least partially characterizing power leakage in the manufactured integrated circuit under test,
        encode the plurality of measurements using a compressive sensing encoding technique at least in part by generating a plurality of random linear combinations of measurements in the plurality of measurements to obtain a plurality of encoded measurements consisting of M encoded measurements, wherein M and N are integers and M is smaller than N, and
        provide the plurality of encoded measurements to an external device external to the at least one circuit; and
    at least one processor housed in the external device and configured to:
        receive the plurality of encoded measurements; and
        determine whether the manufactured integrated circuit under test contains at least one anomaly based, at least in part, on the plurality of encoded measurements.

2. The system of claim 1, wherein generating the plurality of random linear combinations comprises:
    computing at least one weighted sum of measurements in the plurality of measurements, with measurements being weighted by random weights obtained at least in part by using at least one probability distribution.

3. The system of claim 1, wherein M is less than half of N.

4. The system of claim 1, wherein the at least one processor is configured to:
    decode the plurality of encoded measurements, at least in part by using a compressive sensing decoding technique, to obtain a plurality of decoded measurements.

5. The system of claim 4, wherein the at least one processor is configured to determine whether the manufactured integrated circuit under test contains the at least one anomaly, at least in part, by:
    determining whether at least one decoded measurement in the plurality of decoded measurements indicates a level of power leakage in the manufactured integrated circuit under test that substantially deviates from characteristic levels of power leakage in an anomaly-free integrated circuit corresponding to the manufactured integrated circuit under test.

6. The system of claim 1, wherein when the at least one processor determines that the manufactured integrated circuit under test contains the at least one anomaly, the at least one processor is further configured to:
identify a location of the at least one anomaly in the manufactured integrated circuit under test.

7. The system of claim 1, wherein the at least one circuit comprises the manufactured integrated circuit under test.

8. At least one circuit used for testing integrated circuits for presence of anomalies, the at least one circuit configured to:
apply a plurality of inputs to a manufactured integrated circuit under test to obtain a plurality of measurements consisting of N measurements at least partially characterizing power leakage in the manufactured integrated circuit under test;
encode the plurality of measurements using a compressive sensing encoding technique at least in part by generating a plurality of random linear combinations of measurements in the plurality of measurements to obtain a plurality of encoded measurements consisting of M encoded measurements, wherein M and N are integers and M is smaller than N; and
provide the plurality of encoded measurements to an external device external to the at least one circuit.

9. The at least one circuit of claim 8, wherein generating the plurality of random linear combinations comprises:
computing at least one weighted sum of measurements in the plurality of measurements, with measurements being weighted by random weights obtained at least in part by using at least one probability distribution.

10. The at least one circuit of claim 9, further comprising circuitry configured to generate the plurality of inputs and the weights.

11. The at least one circuit of claim 8, wherein M is less than half of N.

12. The at least one circuit of claim 11, wherein M is less than 25 percent of N.

13. The at least one circuit of claim 12, wherein M is less than 10 percent of N.

14. A method for testing integrated circuits for presence of anomalies, the method comprising:
applying, by at least one circuit, a plurality of inputs to a manufactured integrated circuit under test to obtain a plurality of measurements consisting of N measurements at least partially characterizing power leakage in the manufactured integrated circuit under test;
encoding, by the at least one circuit, the plurality of measurements using a compressive sensing encoding technique at least in part by generating a plurality of random linear combinations of measurements in the plurality of measurements to obtain a plurality of encoded measurements consisting of M encoded measurements, wherein M and N are integers and M is smaller than N;
providing, by the at least one circuit, the plurality of encoded measurements to an external device external to the at least one circuit;
receiving, by the external device, the plurality of encoded measurements; and
determining, by the external device, whether the manufactured integrated circuit under test contains at least one anomaly based, at least in part, on the plurality of encoded measurements.

15. The method of claim 14, wherein generating the plurality of random linear combinations comprises:
computing at least one weighted sum of measurements in the plurality of measurements, with measurements being weighted by random weights obtained at least in part by using at least one probability distribution.

16. The method of claim 15, wherein the at least one probability distribution is a distribution of a Bernoulli random variable or of a Gaussian random variable.

17. The method of claim 14, wherein M is less than half of N.

18. The method of claim 14, further comprising:
decoding the plurality of encoded measurements, at least in part by using a compressive sensing decoding technique, to obtain a plurality of decoded measurements.

19. The method of claim 18, wherein the determining comprises determining whether at least one decoded measurement in the plurality of decoded measurements indicates a level of power leakage in the manufactured integrated circuit under test that substantially deviates from characteristic levels of power leakage in a corresponding anomaly-free integrated circuit.

20. The method of claim 14, further comprising:
identifying a location of the at least one anomaly in the manufactured integrated circuit under test, when it is determined that the manufactured integrated circuit under test contains the at least one anomaly.

* * * * *